(12) United States Patent
Cousins et al.

(10) Patent No.: US 8,597,970 B2
(45) Date of Patent: Dec. 3, 2013

(54) HYBRID POLYSILICON HETEROJUNCTION BACK CONTACT CELL

(75) Inventors: Peter J. Cousins, Menlo Park, CA (US); David D. Smith, Campbell, CA (US); Seung B. Rim, Palo Alto, CA (US)

(73) Assignee: SunPower Corporation, San Jose, CA (US)

( * ) Notice: Subject to any disclaimer, the term of this patent is extended or adjusted under 35 U.S.C. 154(b) by 162 days.

(21) Appl. No.: 13/333,904

(22) Filed: Dec. 21, 2011

(65) Prior Publication Data

US 2013/0164878 A1 Jun. 27, 2013

(51) Int. Cl.
*H01L 31/18* (2006.01)

(52) U.S. Cl.
USPC ...................................... 438/71; 257/E31.13

(58) Field of Classification Search
USPC ...................................... 438/71; 257/E31.13
See application file for complete search history.

(56) References Cited

U.S. PATENT DOCUMENTS

| 8,481,105 | B2* | 7/2013 | Karakida et al. | 427/75 |
| 2009/0285979 | A1* | 11/2009 | Karakida et al. | 427/75 |
| 2010/0154869 | A1* | 6/2010 | Oh et al. | 136/252 |
| 2011/0100457 | A1* | 5/2011 | Kim et al. | 136/259 |
| 2011/0100459 | A1* | 5/2011 | Yoon et al. | 136/259 |
| 2011/0114162 | A1* | 5/2011 | Zaks et al. | 136/255 |
| 2011/0132444 | A1* | 6/2011 | Meier et al. | 136/255 |
| 2011/0139243 | A1* | 6/2011 | Shim et al. | 136/259 |
| 2011/0140226 | A1* | 6/2011 | Jin et al. | 257/460 |
| 2012/0000522 | A1* | 1/2012 | Dennis et al. | 136/256 |
| 2012/0048371 | A1* | 3/2012 | Choi et al. | 136/258 |
| 2012/0129295 | A1* | 5/2012 | Oh et al. | 438/98 |
| 2013/0153025 | A1* | 6/2013 | Hahn et al. | 136/256 |

* cited by examiner

*Primary Examiner* — Alexander Ghyka
*Assistant Examiner* — Stanetta Isaac
(74) *Attorney, Agent, or Firm* — Blakely Sokoloff Taylor Zafman LLP

(57) ABSTRACT

A method for manufacturing high efficiency solar cells is disclosed. The method comprises providing a thin dielectric layer and a doped polysilicon layer on the back side of a silicon substrate. Subsequently, a high quality oxide layer and a wide band gap doped semiconductor layer can both be formed on the back and front sides of the silicon substrate. A metallization process to plate metal fingers onto the doped polysilicon layer through contact openings can then be performed. The plated metal fingers can form a first metal gridline. A second metal gridline can be formed by directly plating metal to an emitter region on the back side of the silicon substrate, eliminating the need for contact openings for the second metal gridline. Among the advantages, the method for manufacture provides decreased thermal processes, decreased etching steps, increased efficiency and a simplified procedure for the manufacture of high efficiency solar cells.

20 Claims, 8 Drawing Sheets

HYBRID POLYSILICON HETEROJUNCTION BACK CONTACT CELL

TECHNICAL FIELD

Embodiments of the subject matter described herein relate generally to solar cell manufacture. More particularly, embodiments of the subject matter relate to thin silicon solar cells and techniques for manufacture.

BACKGROUND

Solar cells are well known devices for converting solar radiation to electrical energy. They can be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact fingers allow an external electrical circuit to be coupled to and be powered by the solar cell.

Efficiency is an important characteristic of a solar cell as it is directly related to the solar cell's capability to generate power. Accordingly, techniques for improving the fabrication process, reducing the cost of manufacturing and increasing the efficiency of solar cells are generally desirable. Such techniques include forming polysilicon and heterojunction layers on silicon substrates through thermal processes wherein the present invention allows for increased solar cell efficiency. These or other similar embodiments form the background of the current invention.

BRIEF DESCRIPTION OF THE DRAWINGS

A more complete understanding of the subject matter can be derived by referring to the detailed description and claims when considered in conjunction with the following figures, wherein like reference numbers refer to similar elements throughout the figures.

DETAILED DESCRIPTION

Figure 1:
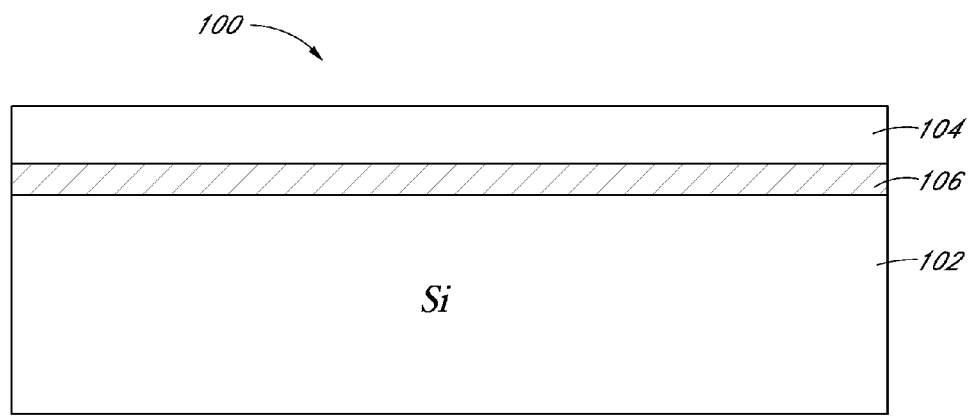
FIG. 1-12 are cross-sectional representations of a solar cell being fabricated in accordance with an embodiment of the invention

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

A method of manufacturing solar cells is disclosed. The method comprises providing a silicon substrate having a thin dielectric layer on the back side, and a deposited silicon layer over the thin dielectric layer, forming a layer of doping material over the a deposited silicon layer, forming an oxide layer over the layer of doping material, partially removing the oxide layer, the layer of doping material and the deposited silicon layer in an interdigitated pattern, growing an oxide layer while simultaneously raising the temperature to drive the dopants from the layer of doping material into the deposited silicon layer, doping the deposited silicon layer with dopants from the layer of doping material to form a crystallized doped polysilicon layer, depositing a wide band gap doped semiconductor and an anti-reflective coating on the back side of the solar cell, and depositing a wide band gap doped semiconductor and anti-reflective coating on the front side of the solar cell.

Another method of manufacturing solar cells is disclosed. The method comprises providing a silicon substrate having a thin dielectric layer on the back side, and a deposited silicon layer over the thin dielectric layer, forming a layer of doping material over the deposited silicon layer, forming an oxide layer over the layer of doping material, partially removing the oxide layer, the layer of doping material and the deposited silicon layer in an interdigitated pattern, etching the exposed silicon substrate to form a texturized silicon region, growing an oxide layer while simultaneously raising the temperature to drive the dopants from the layer of doping material into the deposited silicon layer, doping the deposited silicon layer with dopants from the layer of doping material to form a doped polysilicon layer, covering a first thick layer of wide band gap doped amorphous silicon and anti-reflective coating on the back side of the solar cell, covering an second thin layer of wide band gap doped amorphous silicon and anti reflective coating on the front side of the solar cell and wherein the thin layer is less than 10% to 30% of the thickness of the thick layer.

Still another method of manufacturing solar cells is disclosed. The method comprises providing a silicon substrate having a thin dielectric layer on the back side, and a doped silicon layer over the thin dielectric layer, forming an oxide layer over the doped silicon layer, partially removing the oxide layer and doped silicon layer in an interdigitated pattern, growing a silicon oxide layer over the back side of the solar cell by heating the silicon substrate in an oxygenated environment, wherein the silicon layer is crystallized to form a doped polysilicon layer, depositing a wide band gap doped semiconductor on the back side of the solar cell, and depositing a wide band gap doped semiconductor and anti-reflective coating on the front side of the solar cell.

Still another method of manufacturing solar cells is disclosed. The method comprises providing a silicon substrate having a thin dielectric layer on the back side, and a doped silicon layer over the thin dielectric layer, forming an oxide layer over the doped silicon layer, partially removing the oxide layer and doped silicon layer in an interdigitated pattern, etching the exposed silicon substrate to form a texturized silicon region, growing a silicon oxide layer over the back side of the solar cell by heating the silicon substrate in an oxygenated environment, wherein the silicon layer is crystallized to form a doped polysilicon layer, depositing a wide band gap doped amorphous silicon and an anti-reflective coating on the back side of the solar cell, and depositing a wide band gap doped amorphous silicon and anti-reflective coating on the front side of the solar cell.

Yet another embodiment for a method of manufacturing solar cells is disclosed. The method comprises providing a silicon substrate having a thin dielectric layer on the back side, and a doped silicon layer over the thin dielectric layer, forming an oxide layer over the doped silicon layer, partially removing the oxide layer and doped silicon layer in an interdigitated pattern, etching the exposed silicon substrate to form a texturized silicon region, growing a silicon oxide layer over the back side of the solar cell by heating the silicon substrate in an oxygenated environment, wherein the silicon layer is crystallized to form a doped polysilicon layer, simultaneously depositing a wide band gap doped amorphous silicon and an anti-reflective coating over the front side and back side of the solar cell, partially removing the wide band gap doped semiconductor and oxide layer to form a series of contact openings, and simultaneously forming a first metal grid being electrically coupled to the doped polysilicon layer and a second metal grid being electrically coupled to an emitter region on the back side of the solar cell.

An improved technique for manufacturing solar cells is to provide a thin dielectric layer and a deposited silicon layer on the back side of a silicon substrate. Regions of doped polysilicon can be formed by dopant driving into deposited silicon layers, or by in-situ formation of doped polysilicon regions. An oxide layer and a layer of a wide band gap doped semiconductor can then be formed on the front and back sides of the solar cell. One variant involves texturizing the front and back surfaces prior to formation of the oxide and wide band gap doped semiconductor formation. Contact holes can then be formed through the upper layers to expose the doped polysilicon regions. A metallization process then can be performed to form contacts onto the doped polysilicon layer. A second group of contacts can also be formed by directly connecting metal to emitter regions on the silicon substrate formed by the wide band gap semiconductor layer positioned between regions of the doped polysilicon on the back side of the solar cell.

The various tasks performed in connection with manufacturing processes are shown in FIGS. 1-18. Also, several of the various tasks need not be performed in the illustrated order, and it can be incorporated into a more comprehensive procedure, process or fabrication having additional functionality not described in detail herein.

Figure 2:
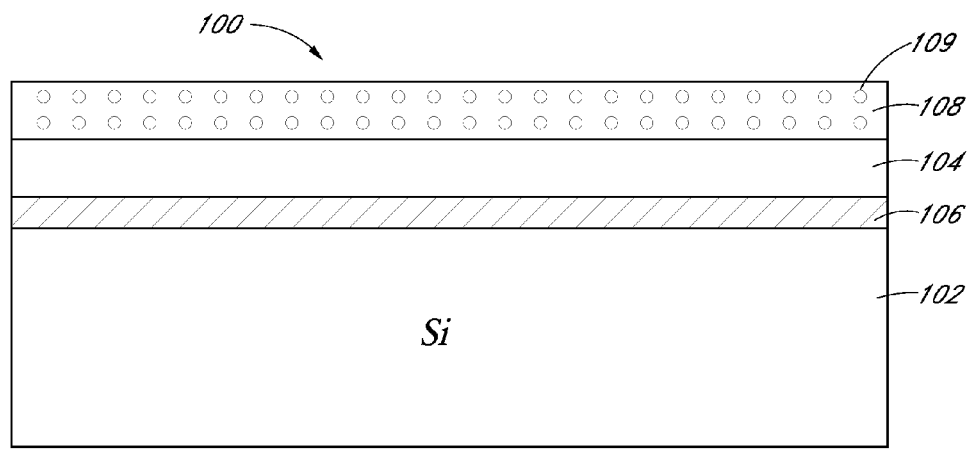
Figure 3:
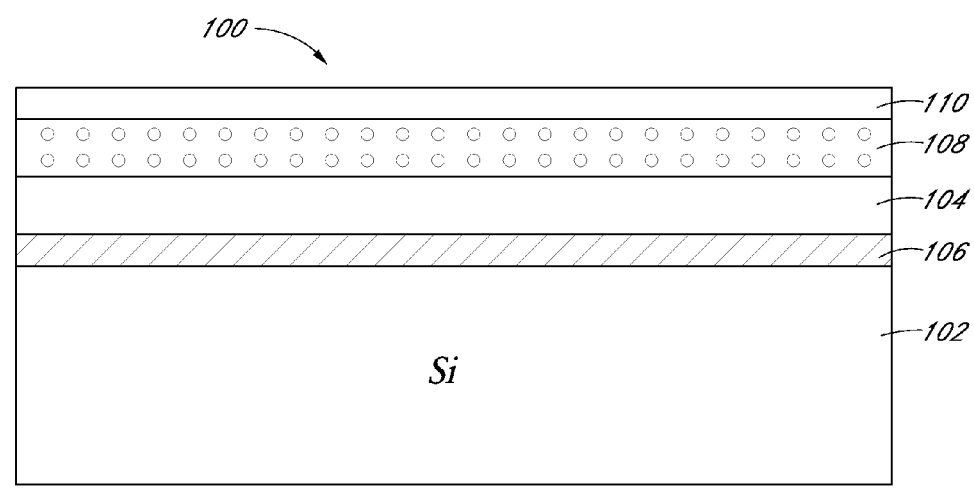

FIGS. 1-3 illustrate an embodiment for fabricating a solar cell 100 comprising a silicon substrate 102, a thin dielectric layer 106, and a deposited silicon layer 104. In some embodiments, the silicon substrate 102 can be cleaned, polished, planarized, and/or thinned or otherwise processed prior to the formation of the thin dielectric layer 106. The thin dielectric layer 106 and deposited silicon layer 104 can be grown through a thermal process. A layer of doping material 108 followed by a first oxide layer 110 can be deposited over the deposited silicon layer 104 through conventional deposition process. The layer of doping material 108 can comprise a doping material, or dopant, 109, but is not limited to, a layer of positive-type doping material such as boron or a layer of negative-type doping material such as phosphorous. Although the thin dielectric layer 106 and deposited silicon layer 104 are described as being grown by a thermal process or deposited through conventional deposition process, respectively, as with any other formation, deposition, or growth process step described or recited here, each layer or substance can be formed using any appropriate process. For example, a chemical vapor deposition (CVD) process, low-pressure CVD (LPCVD), atmospheric pressure CVD (APCVD), plasma-enhanced CVD (PECVD), thermal growth, sputtering, as well as any other desired technique can be used where formation is described. Thus, and similarly, the doping material 108 can be formed on the substrate by a deposition technique, sputter, or print process, such as inkjet printing or screen printing.

Figure 4:
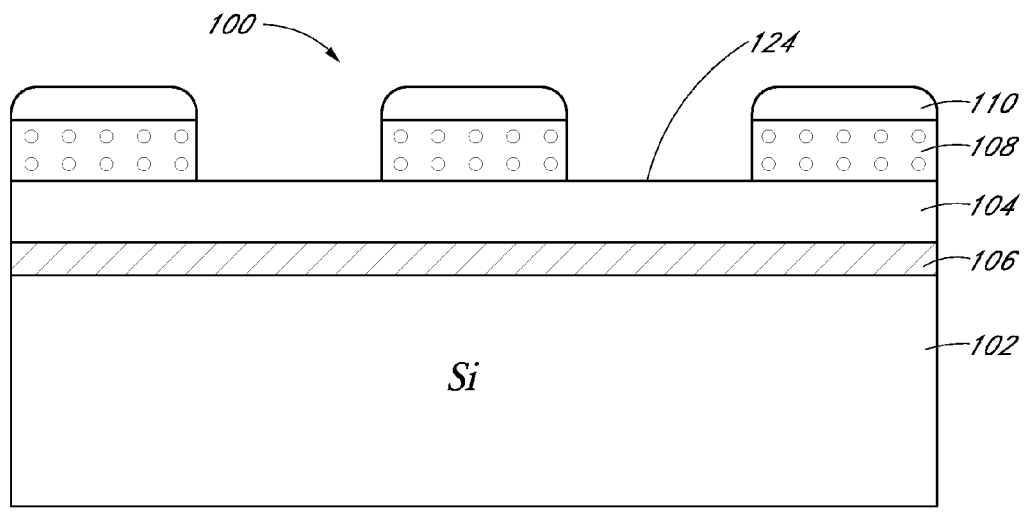

FIG. 4 illustrates the same solar cell 100 from FIG. 1-3 after performing a material removal process to form an exposed polysilicon region 124. Some examples of a material removal process include a mask and etch process, a laser ablation process, and other similar techniques. The exposed polysilicon region 124 and layer of doping material 108 can be formed into any desired shape, including an interdigitated pattern. Where a masking process is used, it can be performed using a screen printer or an inkjet printer to apply a mask ink in predefined interdigitated pattern. Thus, conventional chemical wet etching techniques can be used to remove the mask ink resulting in the interdigitated pattern of exposed polysilicon regions 124 and layer of doping material 108. In at least one embodiment, portions or the entirety of the first oxide layer 110 can be removed. This can be accomplished in the same etching or ablation process in which regions of the deposited silicon layer 104, and dielectric layer 106 are removed, as shown in FIGS. 4 and 5.

Figure 5:
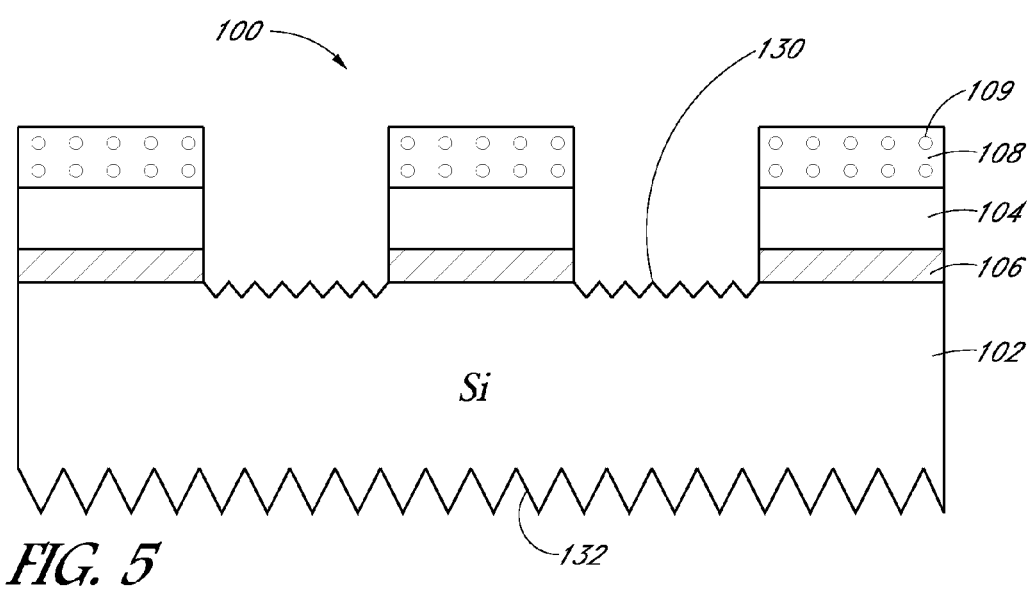

With reference to FIG. 5, the solar cell 100 can undergo a second etching process resulting in etching the exposed polysilicon regions 124 to form a first texturized silicon region 130 on the back side of the solar cell and a second texturized silicon region 132 on the front side of the solar cell for increased solar radiation collection. A texturized surface can be one which has a regular or an irregular shaped surface for scattering incoming light, decreasing the amount of light reflected back off the surface of the solar cell.

Figure 6:
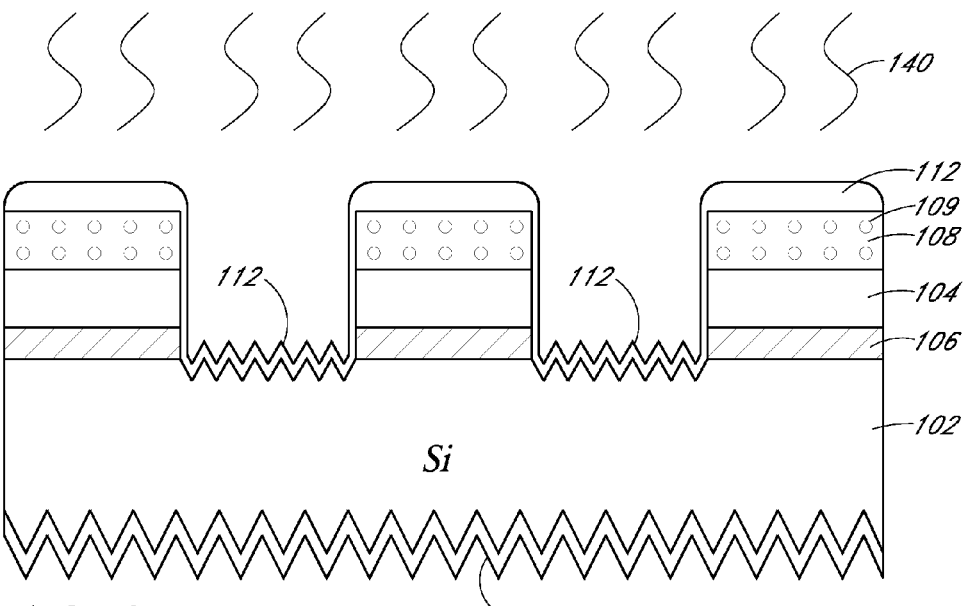

With reference to FIG. 6, the solar cell 100 can be heated 140 to drive the doping material 109 from the layer of doping material 108 into the deposited silicon layer 104. The same heating 140 can also form a silicon oxide or a second oxide layer 112 over the layer of doping material 108 and first texturized silicon region 130. During this process a third oxide layer can be grown 114 over the second texturized silicon region 132. Both the oxide layers 112, 114 can comprise high quality oxide. A high-quality oxide is a low interface state density oxide typically grown by thermal oxidation at temperatures greater than 900 degrees Celsius which can provide for improved passivation.

Figure 7:
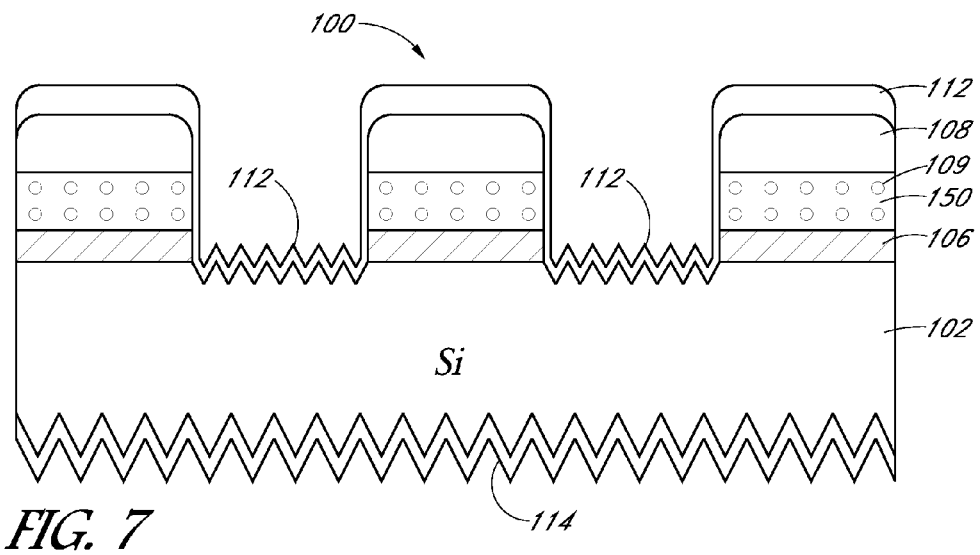

With reference to FIG. 7, the deposited silicon layer 104 can therefore be doped with the doping material 109 from the layer of dopant material 108 to form a doped polysilicon layer 150. In one embodiment, forming a doped polysilicon layer can be accomplished by growing an oxide layer while simultaneously raising the temperature to drive the dopants 109 from the layer of doping material 108 into the deposited silicon layer 104, wherein doping the deposited silicon layer 104 with dopants 109 from the layer of doping material 108 form a crystallized doped polysilicon layer or a doped polysilicon layer 150. In one of several embodiments, the doped polysilicon layer 150 can comprise a layer of positively doped polysilicon given a positive-type doping material is used. In the illustrated embodiment, the silicon substrate 102 comprises bulk N-type silicon substrate. In some embodiments, the doped polysilicon layer 150 can comprise a layer of negatively doped polysilicon if a negative-type doping material is used. In one embodiment, the silicon substrate 102 should comprise bulk P-type silicon substrate.

Figure 8:
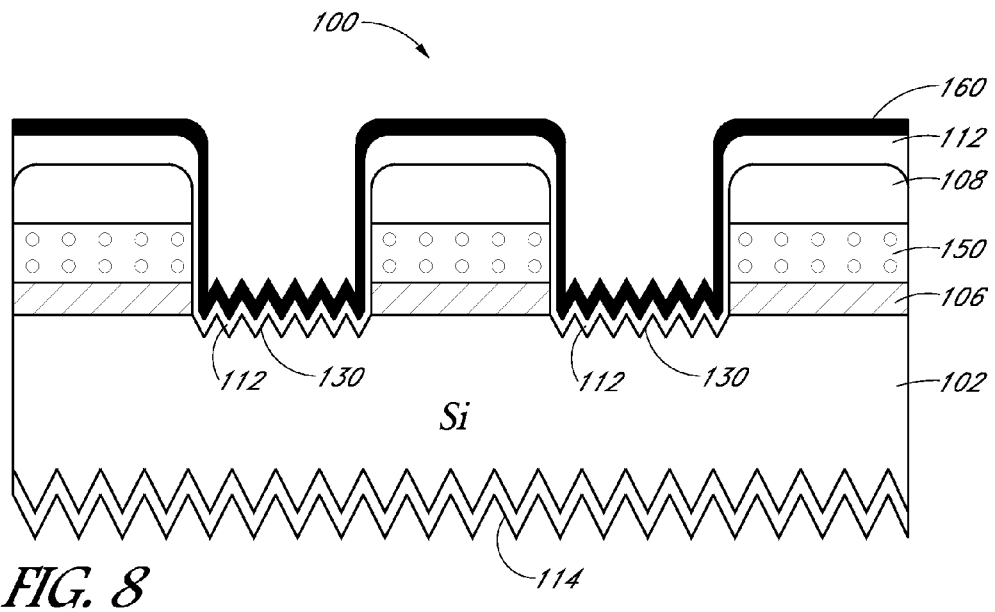

With reference to FIG. 8, a first wide band gap doped semiconductor layer 160 can be deposited on the back side of the solar cell 100. In one embodiment, the first wide band gap doped semiconductor layer 160 is partially conductive with a resistivity of at least 10 ohm-cm. In the same embodiment it can have a band gap greater than 1.05 electron-Volts (eV) acting as a heterojunction in areas of the back side of the solar cell now covered by the first texturized silicon region 130 and by the second oxide layer 112. Examples of a wide band gap doped semiconductor include Silicon carbide and Aluminum Galium Nitride. Any other wide band gap doped semiconductor material which exhibits the properties and characteristics described above can also be used. The first wide band gap doped semiconductor layer 160 can be composed of a first thick wide band gap doped amorphous silicon layer.

Figure 9:
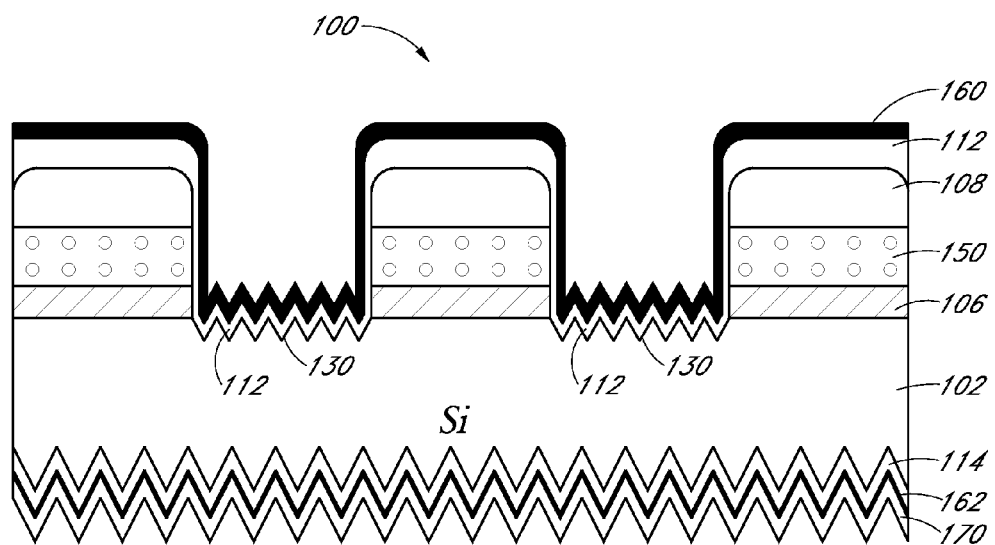

With reference to FIG. 9, a second wide band gap doped semiconductor 162 can be deposited over the second texturized silicon region 132 on the front side of the solar cell 100. In one embodiment, both the wide band gap doped semiconductor layers 160, 162 on the back side and front side of the solar cell 100 can comprise a wide band gap negative-type doped semiconductor. In another embodiment, the second wide band gap doped semiconductor 162 can be relatively thin as compared to the first thick wide band gap doped semiconductor layer. Thus, in some embodiments, the second thin wide band gap doped semiconductor layer can comprise of 10 to 30% of the thickness of the first thick wide band gap doped semiconductor layer. In yet another embodiment both wide band gap doped semiconductor layers 160, 162 on the back side and front side of the solar cell respectively can comprise a wide band gap negative-type doped semiconductor or a wide band gap positive-type doped semiconductor. Subsequently, an anti-reflective coating (ARC) 170 can be deposited over the second wide band gap doped semiconductor 162 in the same process. In another embodiment, an anti-reflective coating 170 can be deposited over the first wide band gap doped semiconductor 160 in the same process. In some embodiments, the ARC 170 can be comprised of silicon nitride.

Figure 10:
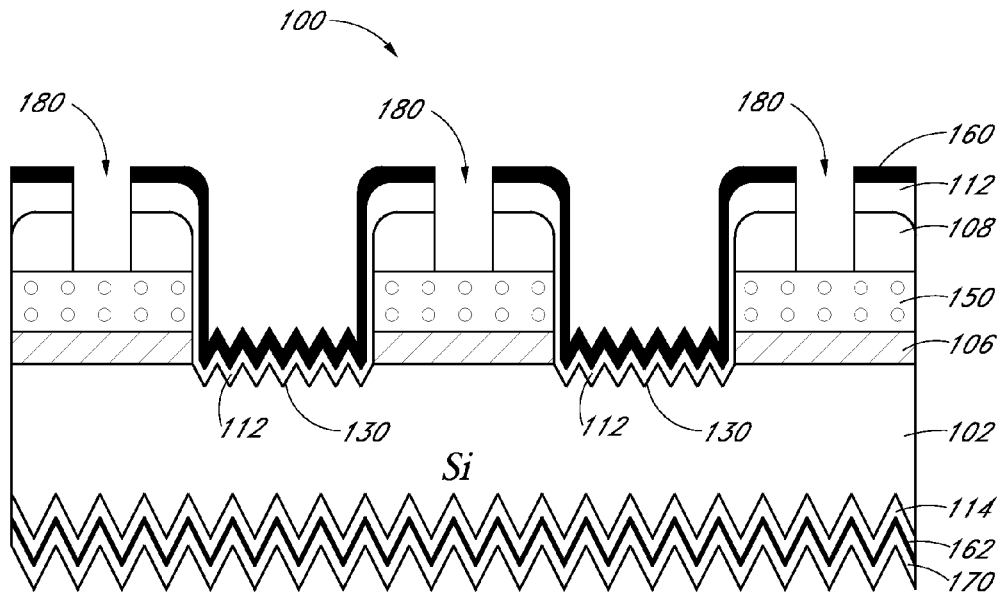

FIG. 10 illustrates the partial removal of the first wide band gap doped semiconductor 160, second oxide layer 112 and the layer of doping material 108 on the back side of the solar cell 100 to form a series of contact openings 180. In one embodiment, the removal technique can be accomplished using an ablation process. One such ablation process is a laser ablation process. In another embodiment, the removal technique can be any conventional etching processes such as screen printing or ink jet printing of a mask followed by an etching process.

Figure 11:
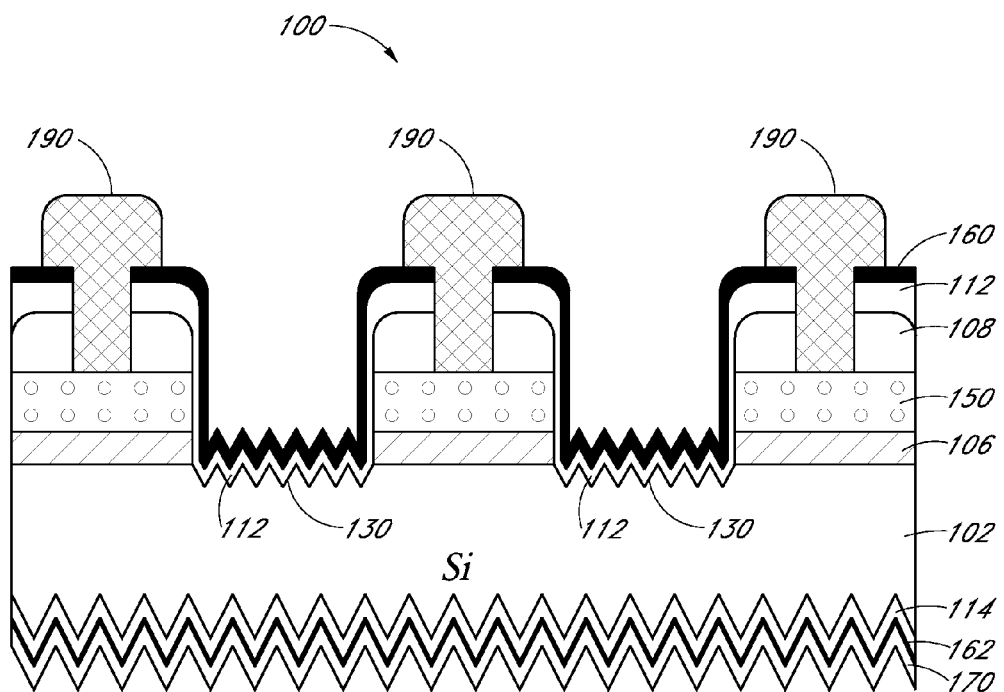

With reference to FIG. 11, a first metal grid or gridline 190 can be formed on the back side of the solar cell 100. The first metal gridline 190 can be electrically coupled to the doped polysilicon 150 within the contact openings 180. In one embodiment, the first metal gridline 190 can be formed through the contact openings 180 to the first wide band gap doped semiconductor 160, second oxide layer 112, and the layer of doping material 108 to connect a positive electrical terminal of an external electrical circuit to be powered by the solar cell.

Figure 12:
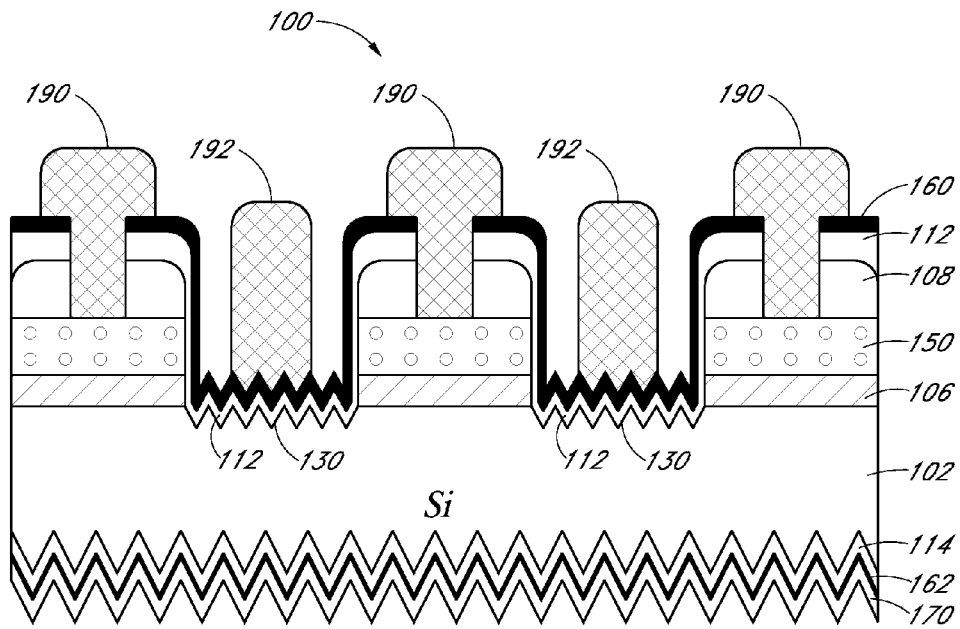

With reference to FIG. 12, a second metal grid or gridline 192 can be formed on the back side of the solar cell 100, the second metal gridline 192 being electrically coupled to the second texturized silicon region 132. In one embodiment, the second metal gridline 192 can be coupled to the first wide band gap doped semiconductor 160, second oxide layer 112, and the first texturized silicon region 130 acting as a heterojunction in areas of the back side of the solar cell to connect to a negative electrical terminal of an external electrical circuit to be powered by the solar cell. In some embodiments the forming of metal grid lines referenced in FIGS. 11 and 12 can be performed through an electroplating process, screen printing process, ink jet process, plating onto a metal formed from aluminum metal nanoparticles or any other metallization or metal formation process step.

FIGS. 13-18 illustrate another embodiment of fabricating a solar cell 200. Unless otherwise specified below, the numerical indicators used to refer to components in FIGS. 13-18 are similar to those used to refer to components or features in FIGS. 1-12 above, except that the index has been incremented by 100.

Figure 13:
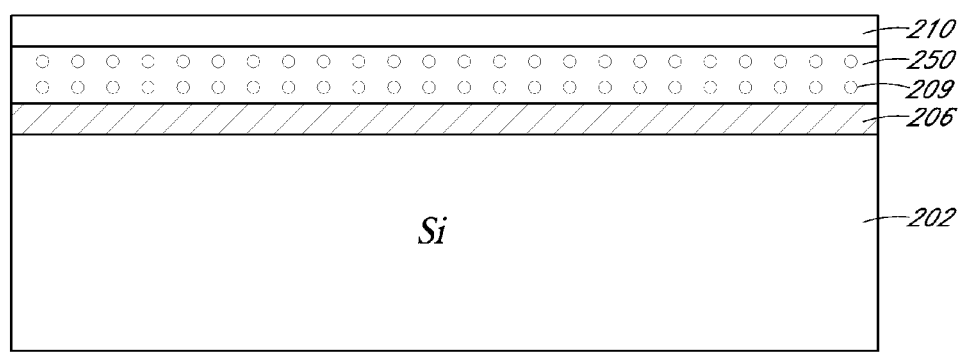
FIG. 13-18 are cross-sectional representations of a solar cell being fabricated in accordance with an another embodiment of the invention
Figure 14:
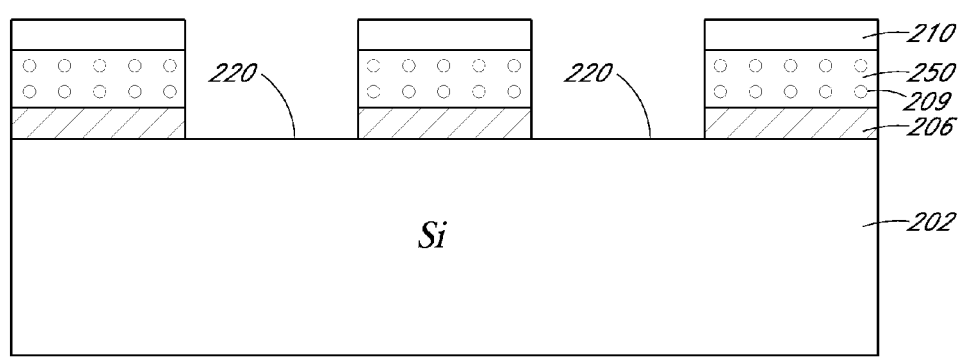

With reference to FIG. 13-14, another embodiment for fabricating the solar cell 200 can comprise forming a first oxide layer 210, a thin dielectric layer 206, a doped polysilicon layer 250 over the silicon substrate 202. The silicon substrate 202 can be cleaned, polished, planarized, and/or thinned or otherwise processed prior to the formation of the thin dielectric layer 206 as discussed similarly above. The first oxide layer 210, dielectric layer 206 and doped polysilicon layer 250 can be grown through a thermal process. In one embodiment, growing the silicon oxide layer or oxide layer 210 over the back side of the solar cell by heating the silicon substrate 202 in an oxygenated environment, wherein a doped silicon layer is crystallized to form the doped polysilicon layer 250. In another embodiment, growing the doped polysilicon layer 250 over the dielectric layer 206 comprises growing a positively doped polysilicon, wherein the positively doped polysilicon can be comprised of a doping material 209 such as a boron dopant. In another embodiment, negatively-doped polysilicon can be used. Although the thin dielectric layer 206 and doped polysilicon layer 250 are described as being grown by a thermal process or deposited through conventional deposition process, respectively, as with any other formation, deposition, or growth process step described or recited here, each layer or substance can be formed using any appropriate process as discussed earlier.

The solar cell 200 can be further processed by partially removing first oxide layer 210, the doped polysilicon layer 250 and dielectric layer 206 to reveal an exposed region of silicon substrate 220 in an interdigitated pattern using conventional masking and etching processes. In the case of using conventional masking and etching processes, an ablation process can be used. If an ablation process is used, the first oxide layer 210 can be left partially intact over the doped polysilicon layer 250 as illustrated in FIG. 14. In another embodiment, a screen print or ink jet printing technique coupled with a etching process can be used. In such an embodiment, the first oxide layer 210 can be etched away from the doped polysilicon layer 250.

Figure 15:
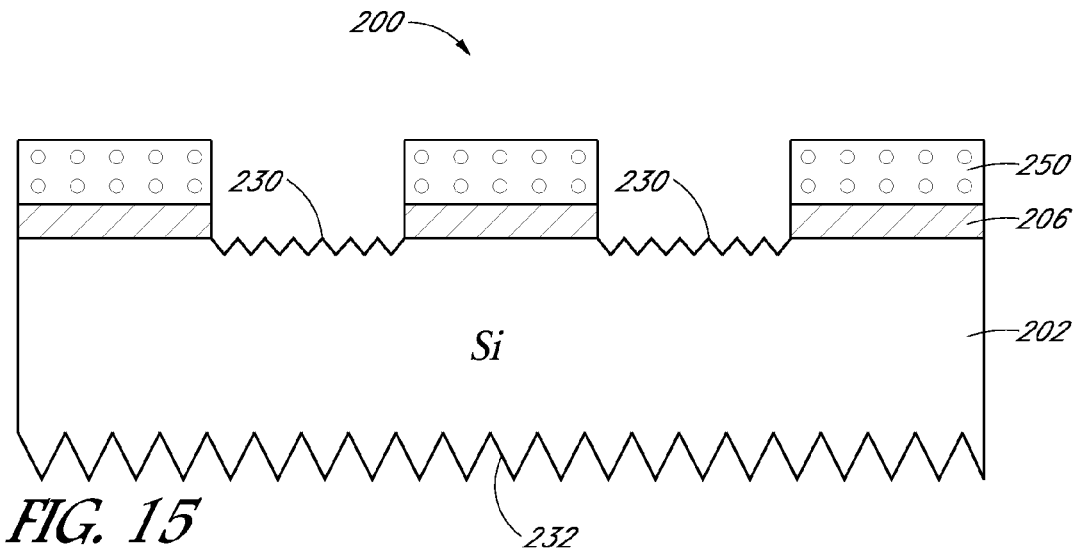

With reference to FIG. 15, the exposed silicon substrate 220 and an exposed region on the front side of the solar cell 200 can be simultaneously etched to form a first texturized silicon surface 230 and second texturized silicon surface 232 for increased solar radiation collection.

Figure 16:
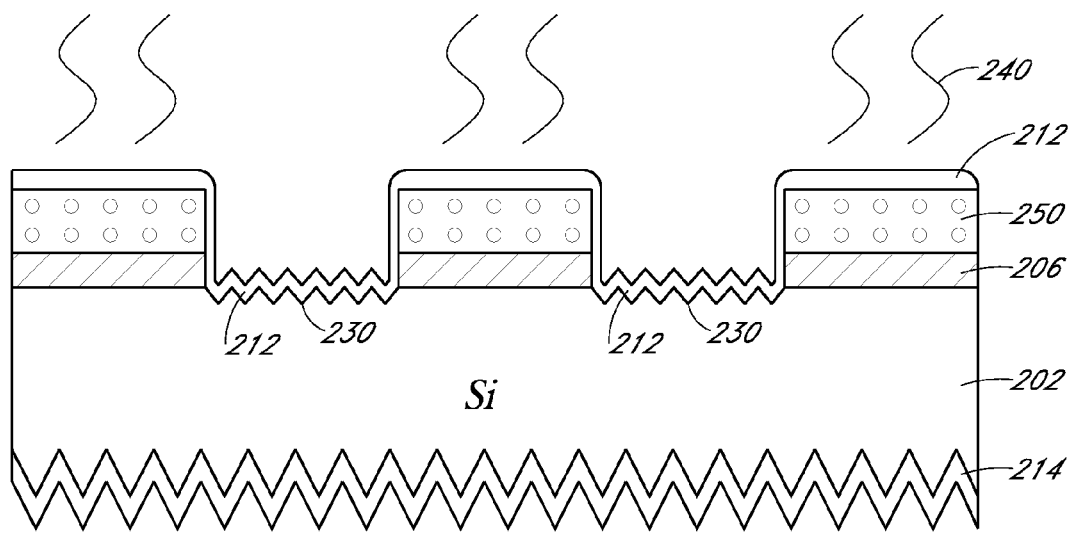

With reference to FIG. 16, the solar cell 200 can be heated 240 to a temperature greater than 900 degrees Celsius while forming a second oxide layer 212 on back side and a third oxide layer 214 on the front side of the solar cell 200. In another embodiment, both the oxide layers 212, 214 can comprise of high quality oxide as discussed earlier.

Figure 17:
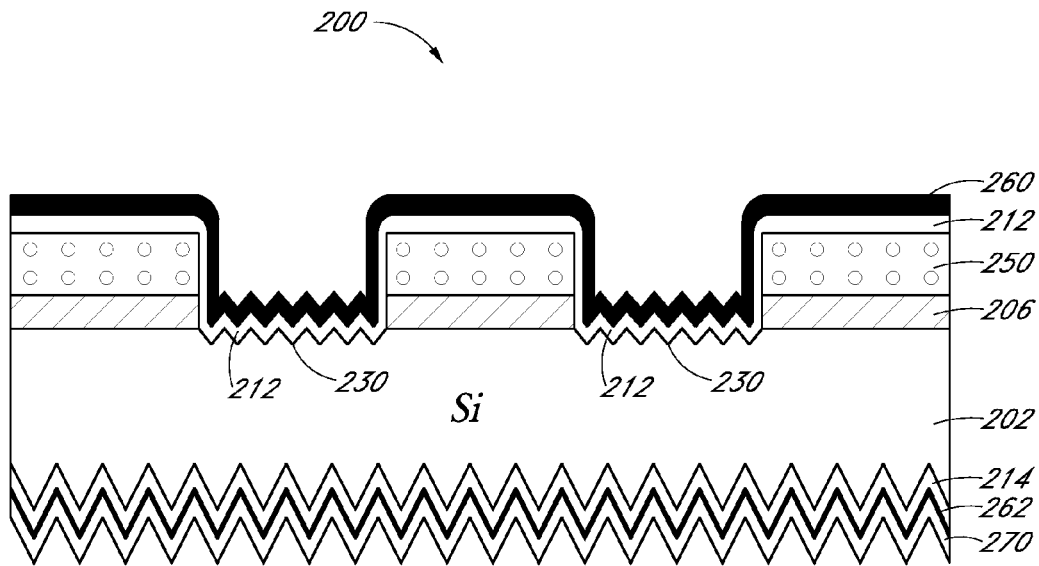

With reference to FIG. 17, the first wide band gap doped semiconductor layer 260 can be simultaneously deposited on the back side and front side of the solar cell. The first wide band gap doped semiconductor layer 260 can be partially conductive having a resistivity greater than 10 ohm-cm. The first wide band gap doped semiconductor layer 260 also can have a band gap greater than 1.05 eV. Additionally, the first wide band gap semiconductor layer can act as a heterojunction in areas of the back side of the solar cell cover the first texturized silicon region 230 and the second oxide layer 212.

The first wide band gap doped semiconductor layer 260 can be 10% to 30% thicker than the second wide band gap doped semiconductor layer 262. In other embodiments, the thickness can vary below 10% or greater than 30% without deviating from the techniques described herein. Both the wide band gap doped semiconductor layers 260, 262 can be positively-doped semiconductor, although in other embodiments with different substrate and polysilicon doped polarities, negatively-doped wide band gap semiconductor layers can also be used. Subsequently an anti-reflective coating (ARC) 270 can be deposited over the second wide band gap doped semiconductor 262. In one embodiment, the anti-reflective coating 270 can be comprised of silicon nitride. In some embodiments, the ARC can be deposited over the first wide band gap doped semiconductor layer 260 as well.

Figure 18:
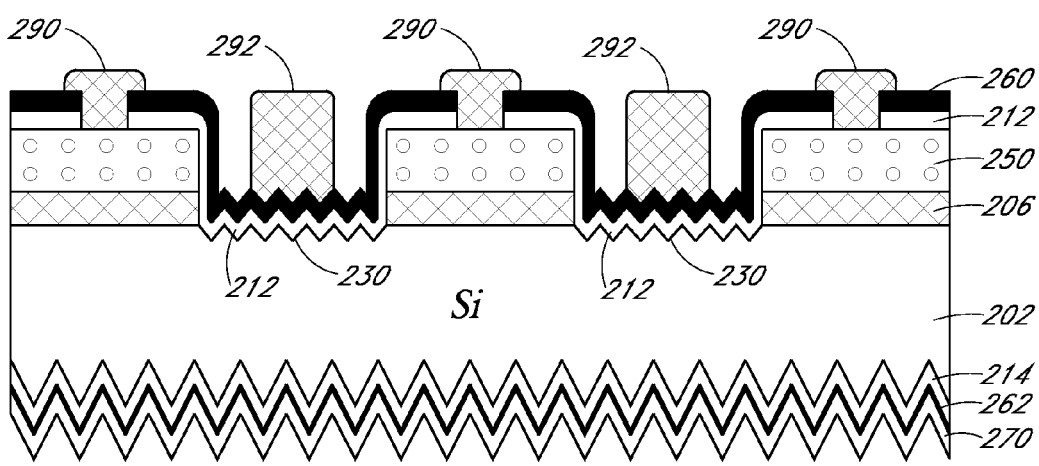

With reference to FIG. 18, the first wide band gap doped semiconductor layer 260 and second oxide layer 212 can be partially removed over the doped polysilicon layer 250 to form a series of contact openings similar to, and with a formative technique similar to, those described above with reference to FIG. 10-12. Subsequently, a first metal gridline 290 can be formed on the back side of the solar cell 200 wherein the first metal gridline 290 can be electrically coupled to the doped polysilicon 250 within the contact openings. A second metal gridline 292 can be formed on the back side of the solar cell 200, the second metal gridline 292 being electrically coupled to the first texturized silicon region or N-type emitter region 230. In one embodiment, both the first and second metal gridlines can be formed simultaneously. Additional contact can then be made to the first and second metal gridlines 290, 292 by other components of an energy system incorporating solar cell 200.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for manufacturing a solar cell comprising a silicon substrate, the silicon substrate having a front side configured to face the sun during normal operation and a back side opposite the front side, and the method comprising:
   providing a silicon substrate having a thin dielectric layer on the back side, and a doped silicon layer over the thin dielectric layer;
   forming an oxide layer over the doped silicon layer;
   partially removing the oxide layer and doped silicon layer in an interdigitated pattern;
   etching the exposed silicon substrate to form a texturized silicon region;
   growing a silicon oxide layer over the back side of the solar cell by heating the silicon substrate in an oxygenated environment, wherein the doped silicon layer is crystallized to form a doped polysilicon layer;
   simultaneously depositing a wide band gap doped amorphous silicon and an anti-reflective coating over the front side and back side of the solar cell;
   partially removing the anti-reflective coating, wide band gap doped amorphous silicon and oxide layer to form a series of contact openings; and
   simultaneously forming a first metal grid being electrically coupled to the doped polysilicon and a second metal grid being electrically coupled to a portion of the interdigitated pattern on the back side of the solar cell.

2. The method of claim 1, wherein the doped polysilicon layer comprises a layer of negatively doped polysilicon.

3. The method of claim 1, wherein the doped polysilicon layer comprises a layer of positively doped polysilicon.

4. The method of claim 1, wherein depositing an anti-reflective coating over the front side and back side of the solar cell comprises depositing silicon nitride on the back and front side of the solar cell.

5. A method for manufacturing a solar cell comprising a silicon substrate, the silicon substrate having a front side configured to face the sun during normal operation and a back side opposite the front side, and the method comprising:
   providing a silicon substrate having a thin dielectric layer on the back side, and a doped silicon layer over the thin dielectric layer;
   forming an oxide layer over the doped silicon layer;
   partially removing the oxide layer and doped silicon layer in an interdigitated pattern;
   etching the exposed silicon substrate to form a texturized silicon region;
   growing a silicon oxide layer over the back side of the solar cell by heating the silicon substrate in an oxygenated environment, wherein the silicon layer is crystallized to form a doped polysilicon layer;
   depositing a wide band gap doped amorphous silicon and an anti-reflective coating on the back side of the solar cell; and
   depositing a wide band gap doped amorphous silicon and anti-reflective coating on the front side of the solar cell.

6. The method of claim 5, wherein the doped polysilicon layer comprises phosphorous.

7. The method of claim 5, wherein the doped polysilicon layer comprises Boron.

8. A method for manufacturing a solar cell comprising a silicon substrate, the silicon substrate having a front side configured to face the sun during normal operation and a back side opposite the front side, and the method comprising:
   providing a silicon substrate having a thin dielectric layer on the back side, and a doped silicon layer over the thin dielectric layer;
   forming an oxide layer over the doped silicon layer;
   partially removing the oxide layer and doped silicon layer in an interdigitated pattern;
   growing a silicon oxide layer over the back side of the solar cell by heating the silicon substrate in an oxygenated environment, wherein the silicon layer is crystallized to form a doped polysilicon layer;
   depositing a wide band gap doped semiconductor on the back side of the solar cell; and
   depositing a wide band gap doped semiconductor and anti-reflective coating on the front side of the solar cell.

9. The method of claim 8, wherein providing the silicon substrate comprises providing a silicon substrate with N type bulk silicon.

10. The method of claim 8, wherein providing the silicon substrate comprises providing a silicon substrate with P type bulk silicon.

11. The method of claim 8, wherein partially removing the oxide layer and doped silicon layer to reveal an exposed region of silicon substrate in an interdigitated pattern comprises using an etching process to remove the oxide layer and the doped silicon layer.

12. The method of claim 8, wherein partially removing the oxide layer and doped silicon layer to reveal an exposed region of silicon substrate in an interdigitated pattern comprises using an ablation process to remove the oxide layer and the doped silicon layer.

13. The method of claim 8, wherein depositing a wide band gap doped semiconductor comprises depositing a wide band gap doped amorphous silicon.

14. The method of claim 8, wherein depositing a wide band gap doped semiconductor comprises depositing a semiconductor with a band gap greater than 1.05 electron-Volts.

15. The method of claim 8, wherein the depositing an anti-reflective coating on the front side of the solar cell comprises depositing silicon nitride on the front side of the solar cell.

16. The method of claim 8 wherein partially removing the oxide layer and the doped silicon layer in an interdigitated pattern further comprises subsequently etching the exposed silicon substrate to form a texturized silicon region.

17. The method of claim 8, further comprising partially removing the wide band gap doped semiconductor, oxide layer and the doped polysilicon layer on the back side of the solar cell to form a series of contact openings.

18. The method of claim 17, further comprising forming a first metal grid on the back side of the solar cell, the first metal grid being electrically coupled to the doped polysilicon layer within the series of contact openings through the wide band gap doped semiconductor and oxide layer.

19. The method of claim 18, further comprising forming a second metal grid on the back side of the solar cell, the second metal grid being electrically coupled to a portion of the interdigitated pattern.

20. The method of claim 19, wherein forming a first metal grid and a second metal grid on the back side of the solar cell comprises simultaneously forming a first metal grid and a second metal grid.

* * * * *